United States Patent [19]
Gutierrez

[11] Patent Number: 5,847,621
[45] Date of Patent: Dec. 8, 1998

[54] LC OSILLATOR WITH DELAY TUNING

[75] Inventor: German R. Gutierrez, Carlsbad, Calif.

[73] Assignee: Applied Micro Circuits Corporation, San Diego, Calif.

[21] Appl. No.: 856,259

[22] Filed: May 14, 1997

[51] Int. Cl.[6] .................................................. H03B 5/12
[52] U.S. Cl. ................................. 331/117 R; 331/177 R
[58] Field of Search .......................... 331/117 R, 117 FE, 331/117 D, 108 C, 108 D, 177 R

[56] References Cited

U.S. PATENT DOCUMENTS

| | | | |
|---|---|---|---|
| 3,815,052 | 6/1974 | Watatani et al. | 331/108 D |
| 4,617,534 | 10/1986 | Lill | 331/117 R |
| 4,775,845 | 10/1988 | McCoy | 331/117 D |
| 5,012,142 | 4/1991 | Sonntag | 307/602 |
| 5,126,692 | 6/1992 | Shearer et al. | 331/8 |
| 5,191,301 | 3/1993 | Mullgrav, Jr. | 331/57 |
| 5,235,293 | 8/1993 | Mendolia | 331/117 D |
| 5,600,280 | 2/1997 | Zhang | 331/57 |

OTHER PUBLICATIONS

Razavi, B. et al, "A 6 GHz 60 mW BiCMOS Phase–Locked Loop", IEEE Journal of Solid–State Circuits, VSC–29, pp. 1560–1565, Dec. 1994.

Tsividis, Yannis, "Mixed Analog–Digital VLSI Devices and Technology—an Introduction", McGraw–Hill, pp. 168–170, 1996.

*Primary Examiner*—Siegfried H. Grimm
*Attorney, Agent, or Firm*—Gray Cary Ware & Freidenrich

[57] ABSTRACT

An integrated circuit voltage-controlled oscillator includes an amplifier, a low Q LC resonator coupled to the amplifier, and a voltage-controlled variable delay element connected to delay feedback between an output and an input of the amplifier.

20 Claims, 4 Drawing Sheets

| Vc (V) | Vc−Vcn (V) | F (GHz) |
|---|---|---|
| 1.76 | −0.49 | 1.741 |
| 1.8 | −0.45 | 1.819 |
| 1.9 | −0.35 | 1.953 |
| 1.95 | −0.3 | 2.02 |
| 2 | −0.25 | 2.087 |
| 2.1 | −0.15 | 2.176 |
| 2.2 | −0.05 | 2.232 |
| 2.3 | 0.05 | 2.276 |
| 2.4 | 0.15 | 2.31 |
| 2.5 | 0.25 | 2.332 |
| 2.6 | 0.35 | 2.354 |
| 2.73 | 0.48 | 2.377 |
| 2.85 | 0.6 | 2.388 |
| 2.96 | 0.71 | 2.41 |
| 3.1 | 0.85 | 2.421 |
| 3.3 | 1.05 | 2.432 |
| 3.57 | 1.32 | 2.421 |
| 4.14 | 1.89 | 2.411 |

LC OSCILLATOR WITH DELAY TUNING

BACKGROUND OF THE INVENTION

The invention concerns a voltage controlled oscillator (VCO) for integrated circuit applications, including data communications. More particularly, the invention concerns a VCO including a differential amplifier in combination with a low Q LC resonator, the VCO including a variable delay element that tunes the oscillator frequency in response to a voltage.

The design of phase-locked loops for implementation in integrated electronic circuits (IC) always includes a voltage controlled oscillator (VCO) that converts an input voltage to a signal having a frequency linearly dependant on the magnitude of the voltage. Typically, the VCO in an integrated circuit comprises a monolithic amplifier section with a resonant circuit external to the amplifier or a fully integrated solid state device, such as a ring oscillator, that does not include an LC section.

In those implementations that include external resonant circuits, advantage is gained in precision and Q. However, where size and cost are important factors, fully monolithic circuits that include voltage-controlled ring oscillators have the advantage.

IC manufacturing technology does provide for the manufacture of fully integrated VCOs having a resonator that includes reactive elements. However, in these applications inductor size and performance are quite limited, and monolithic inductors typically exhibit significant values of resistance and loss. Consequently, monolithic VCOs with LC resonators exhibit low values of Q, typically in the range of $1 \geq Q \geq 10$. Nevertheless, considerations respecting noise performance and frequency selection may sometimes dictate the desirability of fully monolithic VCOs with LC resonators. The desirability of such oscillators would be enhanced by provision of a means for tuning over a reasonably broad tuning range in response to a control voltage.

SUMMARY OF THE INVENTION

The invention combines the features of a LC-tuned oscillator for a monolithic IC with the tuning capabilities of a variable delay element to provide a VCO with a relatively wide tuning range.

The invention is based upon the inventor's critical realization that the low Q of an IC oscillator loop including an amplifier coupled to an LC resonator could be used to advantage by adding variable delay in the loop to tune the frequency of the oscillator. In this regard, the tuning range is inversely related to the Q of the resonator: the higher the Q, the narrower the tuning range that the variable delay will provide. Since integrated LC-tuned oscillators exhibit a low Q (typically$\leq$10), a variable delay element can provide significant tunability (on the order of 10%) in the frequency at which the oscillator oscillates. Provision of a voltage-controlled delay element yields a fully monolithic VCO with an LC resonator.

It is therefore one objective of this invention to provide a VCO for an IC having an LC resonator that may be fully integrated and that will require no external frequency-determining elements.

Another objective is to provide such a VCO in which tuning is provided by a variable delay element that selectively delays an oscillator feedback signal in response to a control voltage.

These and other objectives of the invention are achieved by a VCO having an oscillator loop including an amplifier, a low Q LC resonator and a variable delay element that provides tuning of the oscillator frequency.

BRIEF DESCRIPTION OF THE DRAWINGS

The described objectives of this invention, as well as the invention itself, will now be explained in the following detailed description which refers to the drawings, in which.

DETAILED DESCRIPTION OF THE PREFERRED EMBODIMENTS

The specific circuit embodiments of my invention are illustrated in schematic diagrams based upon bipolar junction technology (BJT) components arranged in differential structures. This is not intended to limit the teachings of my invention to any particular IC family based on material, device, or architecture.

Figure 1:
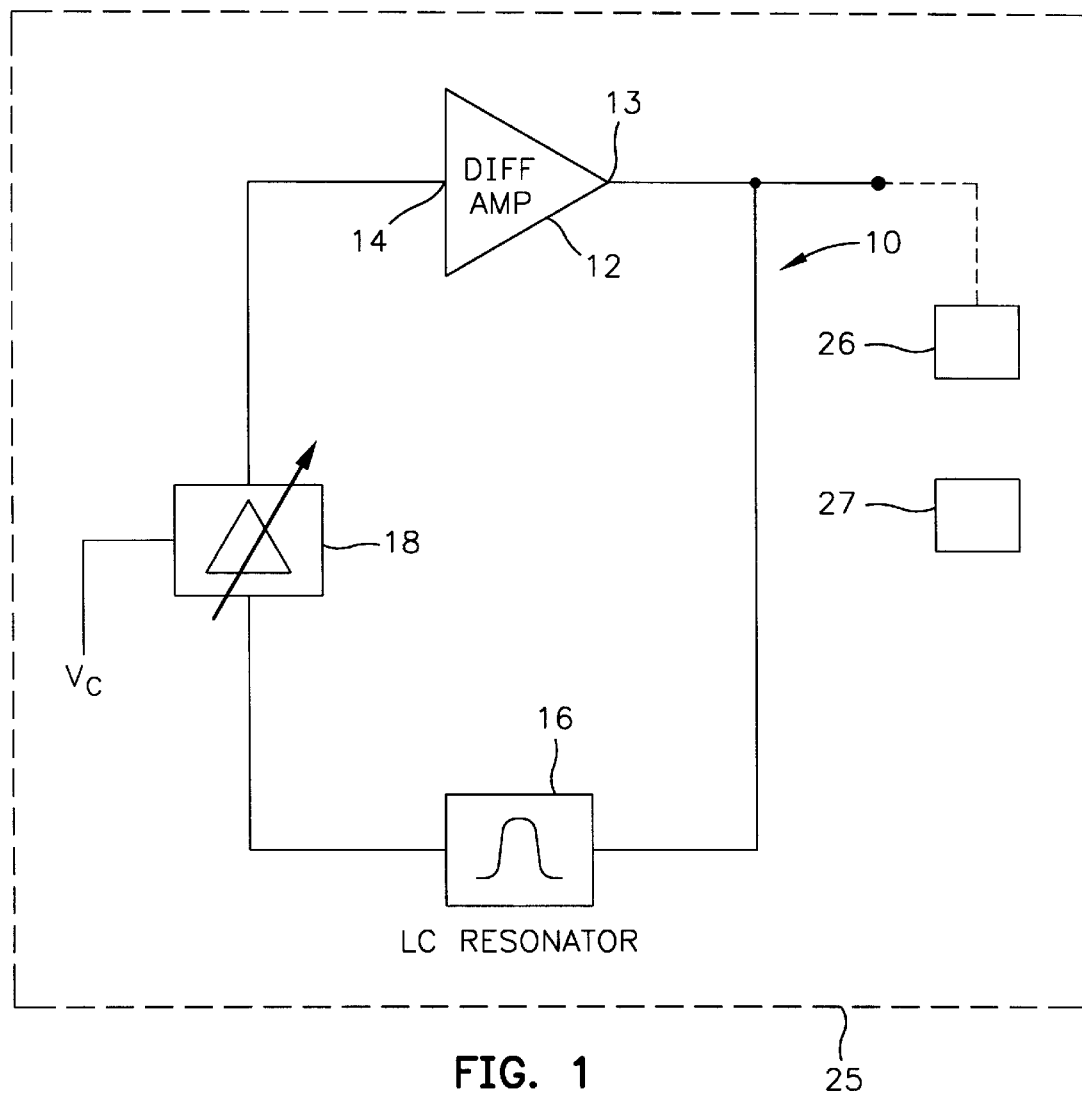
FIG. 1 is a block diagram showing the essential oscillator loop of the invention.

FIG. 1 illustrates the essential complement of elements that make up my invention. In FIG. 1, an oscillator loop 10 includes a differential amplifier 12 having an output node 13 and an input node 14, between which is connected an LC resonator 16. The LC resonator comprises inductive and capacitive elements connected in known configurations to resonate at some frequency. Typically, in an oscillator loop intended to oscillate at a single frequency, the LC resonator 16 would be connected to a feedback path from the output node 13 to the input node 14. In my invention, the Q of the LC resonator 16 is low and feedback of the signal produced by the LC resonator 16 to the input of the differential amplifier 12 is delayed by a time $\Delta$ that is variable. Variable delay is provided by a variable delay circuit 18. The magnitude of the delay caused by the variable delay circuit 18 is a relatively linear function of a control voltage $V_c$ applied to the variable delay circuit 18. The addition of variable delay in the oscillator loop 10 is used to tune the oscillator frequency. Since the delay is varied according to the magnitude of $V_c$, frequency tuning is voltage-controlled and the oscillator loop 10 comprises a voltage-controlled oscillator (VCO).

Preferably, the VCO comprising the oscillator loop 10 is fully monolithic, with all of its elements contained in an integrated circuit (IC) 25 that includes a plurality of circuits, including the VCO and other circuits such as 26 and 27.

My invention has been implemented in differential architecture that has dual complementary outputs and central circuit symmetry, thereby to better reject common-mode disturbances. However the teachings of this description may also be applied to single-ended architecture.

Figure 2:
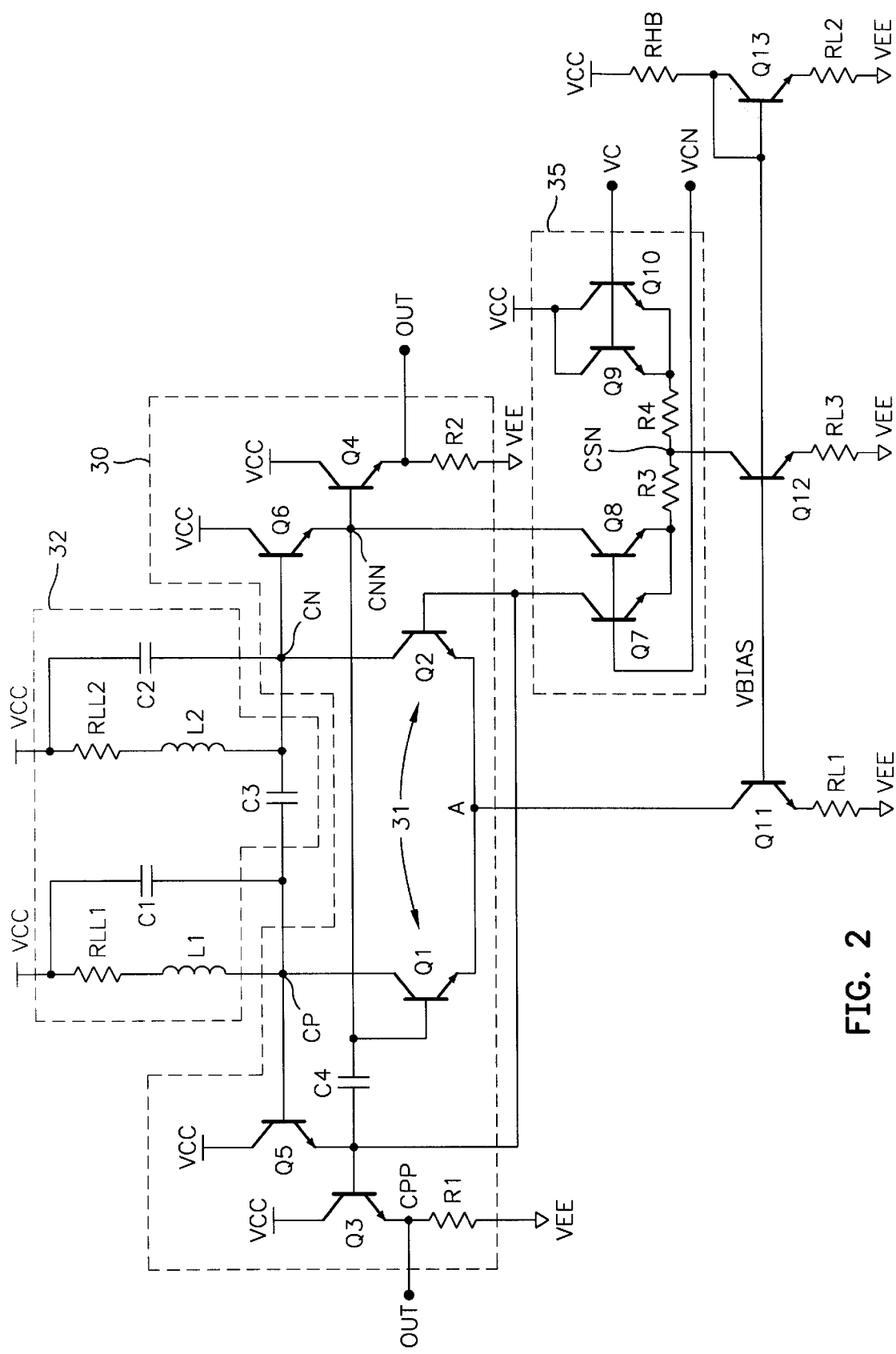
FIG. 2 is an illustration of a first embodiment of the invention.

A circuit first embodying my invention is illustrated in the diagram of FIG. 2. This circuit includes a differential amplifier 30 with a differential amplifier section 31 including a pair of emitter-coupled transistors Q1 and Q2. A first output of the differential amplifier 30 is provided through a buffer comprising a transistor Q3 and a resistor R1. A second output of the differential amplifier 30, complementary to the first output, is provided through a buffer that includes a transistor Q4 and a resistor R2.

An LC resonator 32 is coupled to the differential amplifier 30. The LC resonator 32 includes inductors L1 and L2 and capacitors C1, C2, and C3. The outputs of the differential amplifier section 31 of the differential amplifier 30 are at nodes CN and CP. Each of these nodes is fed back to a respective input of the differential amplifier section 31 so that outputs and inputs are cross-coupled, as required for oscillator operation. In this regard, for example, the output at node CP that is produced on the collector of the transistor Q1 is fed back to the base of the transistor Q2, while the output at node CN on the collector of the transistor Q2 is fed back to the base of the transistor Q1.

In FIG. 2, variable delay elements in the form of emitter follower circuits including transistors Q5 and Q6 are coupled to the feedback paths that cross-couple the outputs and inputs of the differential amplifier section 31 of the differential amplifier 30. In this regard, the feedback from the node CP to the base of the transistor Q2 is through emitter follower transistor Q5, while the feedback from node CN to the base of the transistor Q1 is through emitter follower transistor Q6. The amount of delay between the base and emitter of either of the variable delay elements Q5 and Q6 is a function of the magnitude of the emitter current of each of these transistors. The magnitudes of the emitter currents of the transistors Q5 and Q6 are set by a delay control circuit 35. The delay control circuit 35 includes a differential amplifier having a of sections. Each of the sections includes a pair of matched transistors. The first section includes the matched transistors Q7 and Q8; the second section includes the matched transistors Q9 and Q10. The differential structure of the delay control circuit 35 receives complementary input voltages VC and VCN. The emitters of the transistors of each section are connected through a resistor to a current source node. Specifically, the emitters of the transistors Q7 and Q8 are connected through the resistor R3 to the current source node CSN, while the emitters of the transistors Q9 and Q10 are connected through resistor R4 to the current source node CSN. Current source transistors Q11 and Q12 provide current, respectively, to the transistors of the differential amplifier 30 and to the transistors of the differential delay control circuit 35. The transistor Q13 provides a constant bias voltage to the transistors Q11 and Q12.

The first embodiment of my invention—the circuit of FIG. 2—achieves variable delay by changing the amount of current provided to the emitters of the transistors Q5 and Q6. These currents, which are substantially equal, are generated by the transistors Q7 and Q8 in the differential delay control circuit 35. The differential delay control circuit 35 converts the complementary input voltages (VC-VCN) to the equal currents provided by the transistors Q7 and Q8 to the emitters of the transistors Q5 and Q6. The resistors R3 and R4 invest the differential amplifier of the delay control circuit 35 with large emitter degeneration that linearizes the conversion from the complementary input voltages (VC-VCN) to the control currents produced by the matched transistors Q7 and Q8.

Further adjustment of a range of variable delay is afforded by the capacitor C4 which represents both the layout parasitic capacitance encountered in an integrated circuit and an optional capacitor that may be included to load the emitters of emitter follower transistors, Q5 and Q6.

Figure 3:
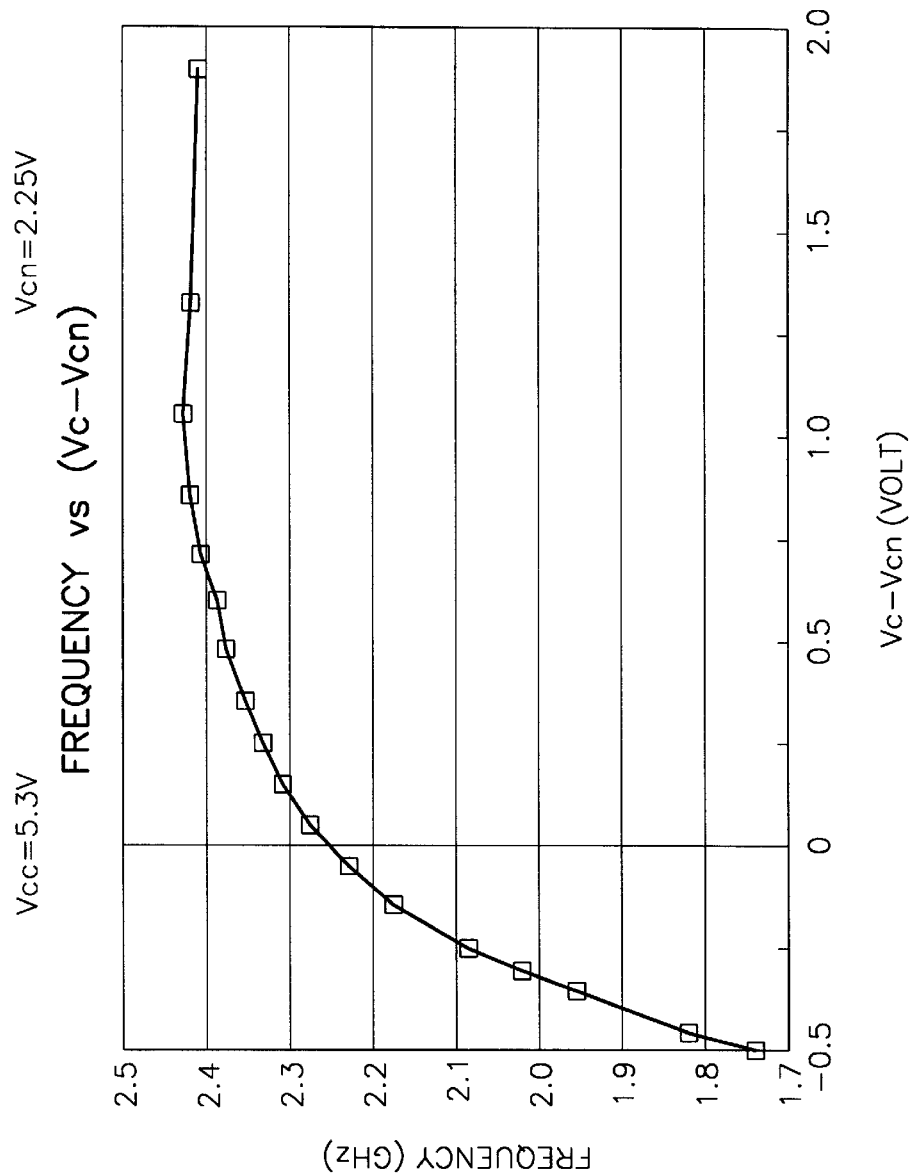
FIG. 3 is a graph illustrating the tuning range of the first embodiment.

FIG. 3 illustrates the relationship between the frequency of oscillation of the circuit of FIG. 2 and the magnitude of the control voltage VC-VCN input to the delay control circuit 35. The plot of FIG. 2 was obtained by applying a constant positive voltage of 2.25 Vdc to the control terminal VCN of the delay control circuit 35, while varying the magnitude of a positive voltage applied to the control terminal VC of the delay control circuit 35. The table that accompanies the plot of the FIG. 3 gives the individual values to which the voltage VC was set (VC(V)), the differential voltage value between the terminals VC and VCN (VC-VCN(V)), and the frequency at which the circuit of FIG. 2 oscillated, measured in an output signal at the OUT terminal. In this regard, FIG. 3 represents measurement of a tuning range of 2.2 to 2.4 GHz at constant power, and an extended range of 1.7 to 2.4 GHz for variable power. The low end of the frequency range exhibited diminishing levels of the output signal. The phase noise has not been precisely measured but it is expected that the first embodiment will display about the same magnitude of such noise as a standard monolithic ring oscillator.

Figure 4:
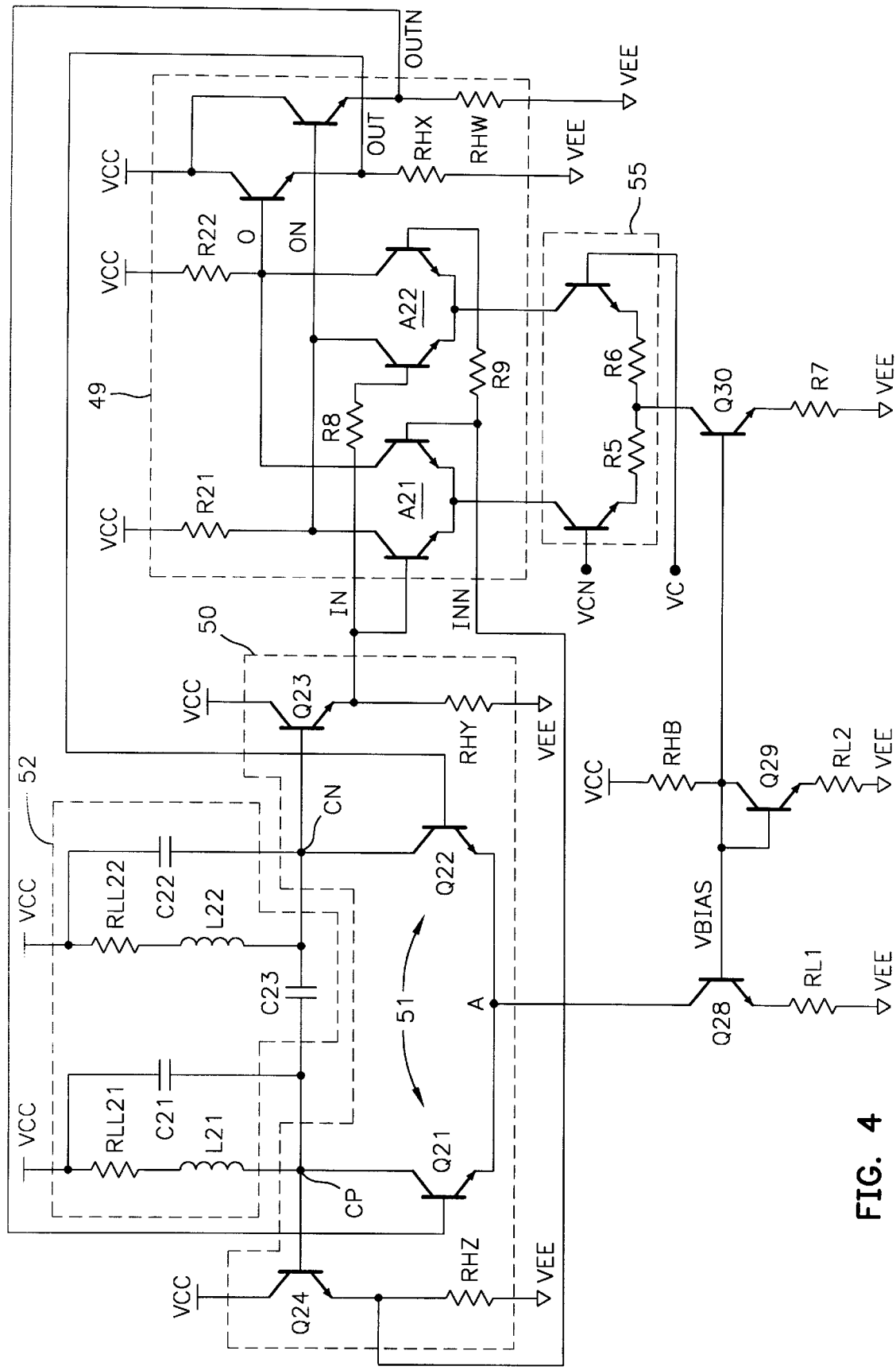
FIG. 4 is a schematic diagram of a second embodiment of the invention.

A second embodiment of my invention is shown in FIG. 4. This VCO uses a differential variable delay stage 49 such as is used, for example, as a stage of a ring oscillator. The delay control in this embodiment is more linear, and potentially provides a broader tuning range, than that achievable in the first embodiment. However the second embodiment cannot oscillate to frequencies as high as the first embodiment, due to the larger minimum delay of its delay stage 49. This circuit is also self-biased, but does not include output buffers. An advantage of the second embodiment is that its control is truly fully differential, in contrast to the circuit of the first embodiment which has pseudo-differential control.

The circuit of FIG. 4 includes a differential amplifier 50 with a differential amplifier section 51 including a pair of emitter-coupled transistors Q21 and Q22. A first output of the differential amplifier 50 is provided through a buffer comprising a transistor Q23 and a resistor RHY. A second output of the differential amplifier 50, complementary to the first output, is provided through a buffer that includes a transistor Q24 and a resistor RHZ.

An LC resonator 52 is coupled to the differential amplifier 50. The LC resonator 52 includes inductors L21 and L22 and capacitors C21, C22, and C23. The outputs of the differential amplifier section 51 are at nodes CN and CP. Each of these nodes is fed back to a respective input of the differential amplifier section 51 so that outputs and inputs are cross-coupled, as required for oscillator operation. For example, the output at node CP that is produced on the collector of the transistor Q21 is fed back to the base of the transistor Q22, while the output at node CN in the collector of the transistor Q22 is fed back to the base of transistor Q21.

The variable delay stage 49 is coupled to the feedback paths that cross-couple the outputs and inputs of the differential amplifier section 51 of the differential amplifier 50. The feedback from the node CP to the base of the transistor Q22 is through the inverting input node INN of the variable delay stage 49, the variable delay stage itself, and the positive output node OUT of the variable delay stage 49. Similarly, the feedback from the node CN to the base of the transistor Q22 is through positive input node IN of the variable delay stage 49, the variable delay stage itself, and the inverted output node OUTN of the variable delay stage 49.

Variable delay through the stage 49 is provided by a pair of cascaded differential amplifier stages A21 and A22. The differential amplifier stages A21 and A22 are connected in parallel, each receiving as differential inputs the signals applied at the ring oscillator input nodes IN and INN, and providing differential outputs at the nodes OUT and OUTN. A differential control circuit 55 differentially varies the amount of current provided to the differential amplifier stages A21 and A22, converting the complementary input voltages (VC-VCN) to the currents provided to the amplifier stages. The relative magnitudes of the currents provided to the amplifier stages A21 and A22 vary according to the magnitude and sign of the voltage (VC-VCN).

In operation, the stage 49 provides a variable delay whose magnitude is directly related to the relative levels of operation of the differential amplifier sections A21 and A22. In this regard, when all current is provided to the differential amplifier section A21 and it is fully on, the differential amplifier section A22 is altogether off, providing the shortest delay. When the differential amplifier section A22 receives all of the current from the differential control circuit 55, it is fully on while the differential amplifier section A21 is altogether off. The base resistors R8 and R9 of the differential amplifier section A22 provide a relatively large input time constant to the amplifier section, resulting in a maximum delay through the variable delay stage 49. The magnitude of delay is varied between these two extremes by varying the relative levels of operation of the differential amplifier sections A21 and A22.

Representative component values for elements of the circuits illustrated in FIGS. 2 and 4 are given in the following tables. It is to be understood that these values merely represent the configurations of two embodiments; therefore I do not intend them to limit the scope of my invention.

TABLE I

COMPONENT VALUES FOR FIG. 2

| | |
|---|---|
| L1, L2 | 2.5nhy |
| C1, C2 | 0.06pfd |
| C3 | 0.4pfd |
| C4 | 0.2pfd |
| $R_1, R_2$ | 8KΩ |
| $R_3, R_4$ | 500Ω |
| RL1, RL2 | 250Ω |
| RL3 | 500Ω |
| RHB | 1KΩ |

COMPONENT VALUES FOR FIG. 4

| | |
|---|---|
| L21, L22 | 2.5nhy |
| C21, C22 | 0.06pfd |
| C23 | 0.4pfd |
| RHX, RHW, RHZ, RHY | 8KΩ |
| R21, R22, R8, R9 | 500Ω |
| RL1, RL2, R5, R6 | 250Ω |
| RHB, R7 | 1KΩ |

My invention is intended to be incorporated into a monolithic integrated circuit during whose manufacture all elements shown in FIGS. 2 and 4 are fabricated on a substrate, including the inductors and capacitors of the low Q LC resonators 32 and 52. Known techniques of integrated circuit manufacture provide for the fabrication of integrated inductors, including spiral inductors. Since I contemplate that my invention may be incorporated in single-sided or differential architectures, the low Q LC resonators preferably may include at least one spiral inductor and at least one fixed capacitor.

As pointed out by Y. Tsividis in MIXED ANALOG-DIGITAL VLSI DEVICES AND TECHNOLOGY, (McGraw-Hill 1995) at pp. 168–170, such inductors "are far from ideal . . . " because of inherent conductive resistance (modeled by the four ohm resistors RLL1 and RLL2 in FIG. 2 and RLL21 and RLL22 in FIG. 4) and resistance between the metal layers used to fabricate the inductors and the substrate on which they are manufactured. As Tsividis remarks, "in standard processes, the resulting inductors leave much to be desired." Op. Cit. at p. 170. Accordingly, those skilled in the art will appreciate that the Q of the VCO circuits that embody my invention can be characterized as "low", in the range of 10 or less, due to the use of inductors made by integrated circuit manufacturing techniques.

While only certain preferred features of this invention have been shown by way of illustration, many changes and modifications will occur to those skilled in the art. Accordingly, it is to be understood that the appended claims are intended to cover all such modifications and changes as fall within the true spirit and scope of the invention.

I claim:

1. A voltage controlled oscillator (VCO) for an integrated electronic circuit (IC), comprising:

an oscillator circuit that includes an amplifier and a low Q LC resonator circuit coupled to the amplifier;

the amplifier including an amplification section and an output section; and a variable delay controller for causing delay of feedback of an oscillator output signal from the output section to the amplification section in response to a voltage signal.

2. The VCO of claim 1, wherein the amplifier is a differential amplifier.

3. The VCO of claim 2, wherein:

the amplification section includes a pair of transistors and the output section includes at least two emitter follower circuits, each emitter follower circuit providing a feedback path to a respective transistor of the pair of transistors; and the variable delay controller includes a differential amplifier having a pair of sections, each section having an input and including a pair of matched transistors, a first pair of the matched transistors are connected for producing emitter currents for the two emitter followers, the emitter currents having substantially equal magnitudes determined by a magnitude of the voltage signal when applied to the input of the section including the other pair of matched transistors.

4. The VCO of claim 2, wherein the variable delay controller includes:

a variable delay element connected to the output section and to the amplification section; and a bias circuit connected to the variable delay element that varies an amount of delay imposed by the variable delay element between the output section and the amplification section.

5. The VCO of claim 4, wherein the amplification section includes two inputs, the variable delay element includes a pair of differential amplifier sections, each coupled to the output section and to an input of the amplification section and the bias circuit includes a differential pair of transistors, each transistor having a collector coupled to a respective one of the pair of differential amplifier sections and a base for receiving the voltage signal.

6. The VCO of claim 1, wherein the LC resonator circuit includes at least one spiral inductor, and at least one fixed capacitor.

7. An integrated circuit (IC), comprising;

an oscillator loop that includes an amplifier and a low Q LC resonator circuit coupled to the amplifier;

the amplifier including an amplification section and an output section; and a variable delay controller for causing delay of feedback of an oscillator output signal from the output section to the amplification section in response to a voltage signal.

8. The IC of claim 7, wherein the amplifier is a differential amplifier.

9. The IC of claim 8, wherein:

the amplification section includes a pair of transistors and the output section includes at least two emitter follower circuits, each emitter follower circuit providing a feedback path to a respective transistor of the pair of transistors; and the variable delay controller includes a differential amplifier having a pair of sections, each section having an input and including a pair of matched transistors, a first pair of the matched transistors are connected for producing emitter currents for the two emitter followers, the emitter currents having substantially equal magnitudes determined by a magnitude of the voltage signal when applied to the input of the section including the other pair of matched transistors.

10. The IC of claim 8, wherein the variable delay controller includes:

a variable delay element connected to the output section and to the amplification section; and a bias circuit connected to the variable delay element that varies an amount of delay imposed by the variable delay element between the output section and the amplification section.

11. The IC of claim 10, wherein the amplification section includes two inputs, the variable delay element includes a pair of differential amplifier sections, each coupled to the output section and to an input of the amplification section and the bias circuit includes a differential pair of transistors, each transistor having a collector coupled to a respective one of the pair of differential amplifier sections and a base for receiving the voltage signal.

12. The IC of claim 7, wherein the LC resonator circuit includes at least one spiral inductor, and at least one fixed capacitor.

13. A monolithic integrated electronic circuit having a substrate, and circuits fabricated on the substrate, at least one of the circuits comprising:

an amplifier with an input and an output;

a low Q LC resonator coupled to the amplifier; and a voltage-controlled delay element connected to the input and output of the amplifier.

14. The monolithic integrated circuit of claim 13, wherein the amplifier is a differential amplifier with an amplification section and an output section.

15. The monolithic integrated circuit of claim 14, wherein:

the amplification section includes a pair of transistors and the output section includes at least two emitter follower circuits, each emitter follower circuit providing a feedback path to a respective transistor of the pair of transistors; and the voltage controlled variable delay element includes a differential amplifier having a pair of sections, each section having an input and including a pair of matched transistors, a first pair of the matched transistors are connected for producing emitter currents for the two emitter followers, the emitter currents having substantially equal magnitudes determined by a magnitude of a voltage signal when applied to the input of the section including the other pair of matched transistors.

16. The monolithic integrated circuit of claim 14, wherein the voltage-controlled variable delay element includes:

a variable delay circuit connected to the output section and to the amplification section; and a bias circuit connected to the variable delay circuit that varies an amount of delay imposed by the variable delay circuit between the output section and the amplification section.

17. The monolithic integrated circuit of claim 16, wherein the amplification section includes two inputs, the variable delay circuit includes a pair of differential amplifier sections, each coupled to the output section and to an input of the amplification section and the bias circuit includes a differential pair of transistors, each transistor having a collector coupled to a respective one of the pair of differential amplifier sections and a base for receiving a voltage signal.

18. The monolithic integrated circuit of claim 13, wherein the LC resonator circuit includes at least one spiral inductor, and at least one fixed capacitor.

19. The monolithic integrated circuit of claim 13, wherein the voltage-controlled delay element includes an emitter follower.

20. The monolithic integrated circuit of claim 13, wherein the voltage-controlled delay element includes a differential delay stage.

* * * * *

UNITED STATES PATENT AND TRADEMARK OFFICE
CERTIFICATE OF CORRECTION

PATENT NO. : 5,847,621
DATED : December 8, 1998
INVENTOR(S) : Gutierrez

It is certified that error appears in the above-identified patent and that said Letters Patent is hereby corrected as shown below:

ON TITLE PAGE - Title should be

Item [54] LC OSCILLATOR WITH DELAY TUNING

Signed and Sealed this

Twenty-fifth Day of May, 1999

Attest:

Q. TODD DICKINSON

*Attesting Officer*    Acting Commissioner of Patents and Trademarks